NON-SATURATING INHIBIT SWITCHING CIRCUIT

Filed May 24, 1966

*INVENTORS*
DANIEL W. MURPHY
JOHN R. TURNBULL JR.
JAMES L. WALSH
*BY* David M. Koffsky
*ATTORNEY*

3,483,398
NON-SATURATING INHIBIT SWITCHING CIRCUIT

Daniel W. Murphy, Santa Clara, Calif., and John R. Turnbull, Jr., Wappingers Falls, and James L. Walsh, Hyde Park, N.Y., assignors to International Business Machines Corporation, Armonk, N.Y., a corporation of New York Filed May 24, 1966, Ser. No. 552,563
Int. Cl. H03k *19/40*
U.S. Cl. 307—214 4 Claims

ABSTRACT OF THE DISCLOSURE

A non-saturating transistor bilevel inhibit circuit is provided. Semiconductor circuit means is connected to a switching transistor wherein the semiconductor circuit means is selectively responsive to a one state of a logical circuit input signal so as to maintain the switching transistor in a non-saturating state and virtually removed as a functional element during the other state of a circuit input signal.

This invention relates to switching circuits and more particularly to a nonsaturating switching circuit which exhibits an inhibit function.

Present day high speed computer circuits make significant use of nonsaturated transistor operation. These circuits are preferably comprised of like conductivity transistors which operate about preset binary logic voltage levels. There are many forms which such circuits take to perform desired logical connectives. One such connective—the inhibit function—uses a dominant control input to govern the status of one or more logical outputs and is somewhat difficult to economically embody in nonsaturated bi-level transistor logic.

One such inhibit circuit is described in U.S. Patent 3,118,073 to J. L. Walsh entitled "Nonsaturating Inverter for Logic Circuits" and assigned to the same assignee as is this application. The Walsh patent describes the use of a cascode arrangement of nonsaturating transistors for the purpose of providing the inhibit function. The advantage of the cascode circuit is that identical logical levels perform both the logic and the inhibit function. Notwithstanding this desirable feature, the cascode circuit begins to exhibit certain undesirable transient characteristics when operated at the extremely high circuit speeds which are required in modern day data processng system (to be discussed in greater detail hereinafter).

Accordingly, it is an object of this invention to provide an improved nonsaturating switching circuit.

It is still another object of this invention to provide an improved nonsaturating inhibit circuit.

Yet another object of this invention is to provide an improved cascode inhibit circuit.

In accordance with the above stated objects, a cascode inhibit circuit including first and second semiconductors is modified to include a degenerative control circuit connected between the base and collector terminals of the second semiconductor. The degenerative control circuit is activated upon the nonconduction of the first cascode semiconductor to establish a predetermined potential at the collector of the second semiconductor while simultaneously shifting the base potential of the second semiconductor in a direction which prevents charge storage therein.

The foregoing and other objects, features and advantages of the invention will be apparent from the following more particular description of a preferred embodiment of the invention, as illustrated in the accompanying drawings.

Figure 1:
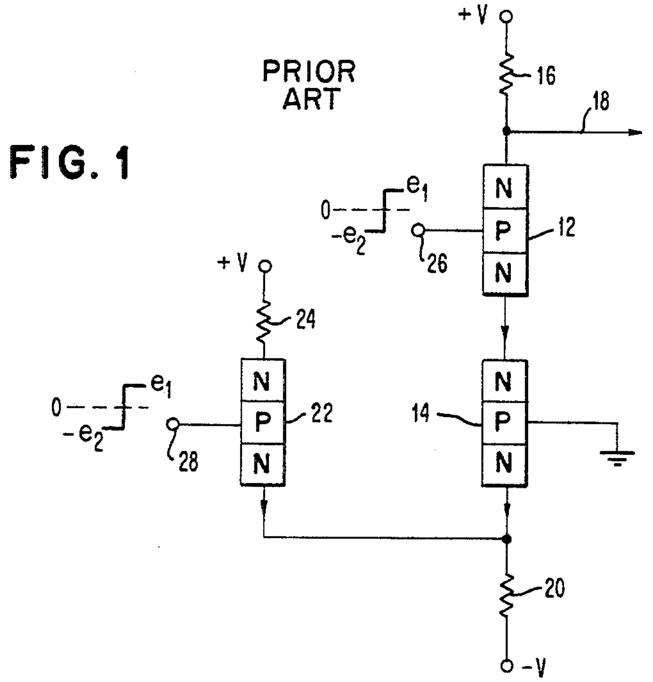
FIG. 1 is a circuit diagram of the prior art cascode inhibit circuit.

Referring now to FIG. 1, a cascode circuit similar to that described and claimed in the aforementioned Walsh U.S. Patent 3,118,073 is shown. The emitter of transistor 12 is directly connected to the collector electrode of transistor 14 to provide a cascode arrangement. A suitable source of potential (+V) is connected via resistor 16 to the collector of transistor 12 and the circuit's logical output is taken via conductor 18 to a succeeding stage of logic. The base circuit of transistor 14 is connected directly to a common potential while its emitter circuit is connected via resistor 20 to a source of suitable operating potential —V. An inhibit transistor 22 has its emitter connected in common with the emitter of transistor 14 to resistor 20 while its collector is connected via resistor 24 to a source of suitable operating potential +V. The logical inputs to the circuit are applied via input terminals 26 and 28 which are respectively connected to the base terminals of transistors 12 and 22. The logical levels to terminals 26 and 28 are bilevel with the up level ($e_1$) being positive with respect to the common potential and the down level($-e_2$) being negative with respect to the common potential.

When down potentials ($-e_2$) are applied to input terminals 26 and 28, both transistors 12 and 22 are rendered nonconductive. Due to the application of the down potential at terminal 26, the emitter potential of transistor 12 is held at a somewhat more negative value than $-e_2$ due to the emitter-base diode drop. The resultant negative potential at the emitter of transistor 12 forward biases the collector-base junction of transistor 14 with a resultant saturation thereof. Due however to the nonconductive state of transistor 12, no current is allowed to flow through transistor 14.

When an up level ($e_1$) is applied to input terminal 26, transistor 12 is rendered conductive and the resulting rise in its emitter potential pulls transistor 14 out of saturation. As transistor 14 comes out of saturation, the current through transistor 12 is clamped to the reverse biased collector current of transistor 14.

If it is now assumed that an up level is applied to input terminal 28, transistor 22 becomes conductive with a resultant rise in its emitter potential. This rise reverse biases the emitter-base junction of transistor 14 and renders it nonconductive thereby causing the current through transistor 12 to cease.

While the above circuit operates in a satisfactory manner for relatively low speed logical applications, a problem arises in its use as a logical connective in high speed logic applications. As aforestated, when down levels are applied to input terminals 26 and 28 respectively, transistor 14 is held in a saturated state due to the forward bias of its collector-base junction. This results in a substantial charge build-up across the collector-base junction of transistor 14. If up levels are now applied simultaneously to input terminals 26 and 28, no change should be reflected in the output potential on conductor 18. More specifically, while transistor 12 will be rendered conductive by the up level on input terminal 26, transistor 22 will also be rendered conductive and the current flow therethrough will reverse bias the emitter base junction of saturated transistor 14. This action should prevent current flow through transistor 12 and prevent any fall in the output potential on conductor 18. In reality, when transistor 14 is rendered nonconductive by the resultant conduction of transistor 22, the conductive state of transistor 12 forms an ideal charging path for the collector-base capacitance of transistor 14. Due to the fact that a substantial negative charge is built up across the collector-base junction of transistor 14 when a down potential is applied at the base of transistor 12, the rendering of transistor 12 conductive allows a current to flow through resistor 16 to discharge this negative potential. This results in a substantial drop in the output level of conductor 18 until the collector-base charge in transistor 14 has been dissipated by the charging current through resistor 16. This undesirable phenomenon is not experienced if sufficiently slow rise time logic signals are applied to input terminals 26 and 28. The application of such slow rise time signals provides sufficient time for the discharge of the collector-base capacitance of transistor 14 thereby preventing the aforementioned negative-going signal from appearing on output conductor 18.

Figure 2:
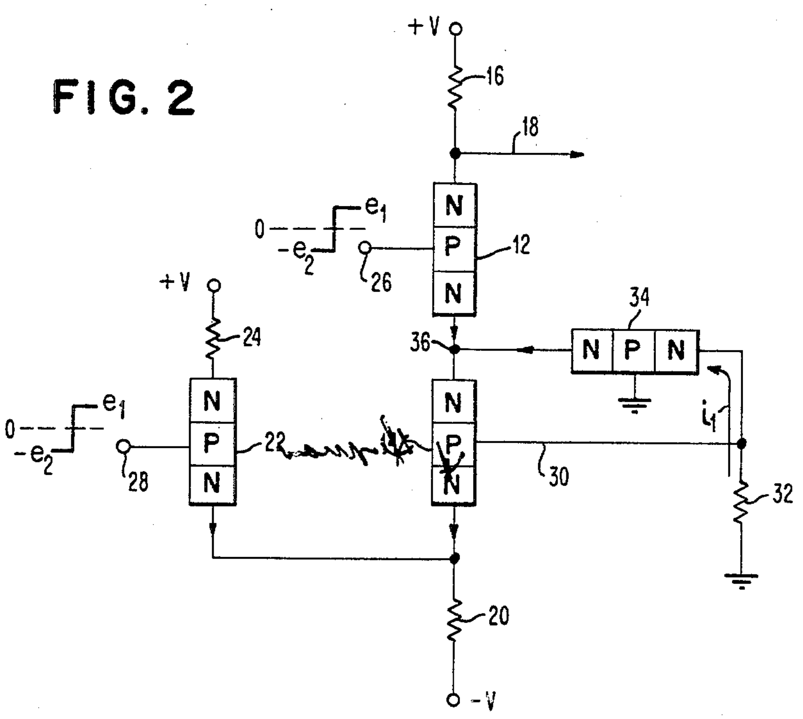
FIG. 2 is a circuit diagram embodying the invention.

Referring now to FIG. 2, circuit elements identical to those shown in FIG. 1 are numbered correspondingly. In lieu of grounding the base of transistor 14, as in FIG. 1, base conductor 30 is connected via resistor 32 to ground. Conductor 30 is also connected through a grounded-base transistor 34 to node 36 between the emitter of transistor 12 and collector of transistor 14.

As stated with regards to the prior art circuit shown in FIG. 1, its major problem arises when the base terminal of transistor 12 is at its most negative level ($-e_2$). Under this condition, transistor 12 is nonconducting and its emitter potential is at its most negative level. Thus, in the circuit of FIG. 1, the collector-base junction of transistor 14 is forward biased and saturated. In the circuit of FIG. 2 transistor 34 in combination with resistor 32 prevents this situation from occurring. In the following discussion, it will be assumed that transistor 22 is nonconductive and essentially out of the circuit. Thus, transistor 14 is free to conduct whenever transistor 12 is conductive.

Assuming first that the input applied to terminal 26 is at the more positive level ($e_1$), the emitter base junction of transistor 12 is forward biased and transistor 12 is conductive. Under these circumstances, the potential at node 36 resulting from the positive potential at terminal 26 is sufficiently high to reverse bias the emitter base junction of transistor 34 thus eliminating it from the circuit. As a result, the potential applied to the base of transistor 14 via conductor 30 is slightly less than ground (due to base current) and allows this circuit to operate in the normal cascode manner. The current which flows through transistor 12, thus passes through transistor 14, resistor 20 to —V.

Assuming now that the potential at terminal 26 traverses to the more negative logic level ($-e_2$), the emitter-base junction of transistor 12 is reverse biased and it becomes nonconductive. The potential at node 36 therefore reaches a value between $-e_2$ and 0 volts, so as to place the base to emitter junction of transistor 12 in a back-biased state. As a result, transistor 12 is essentially out of the circuit. With the emitter of transistor 34 at some negative value between 0 and $-e_2$ volts and the base of transistor 34 at ground or a relatively positive potential, the base-emitter junction of transistor 34 is forward biased and transistor 34 is rendered conductive. As a result, current $i_1$ commences to flow through the path constituting resistor 32, transistor 34, transistor 14, and resistor 20, and finally to source —V. Viewed in another manner, it can be seen that the emitter terminals of both transistors 12 and 34 are commonly coupled at node 36. Also, the base of transistor 34 is fixed at ground potential. Therefore, current will flow through transistor 12 when the terminal 26 is connected to $e_1$ and not through transistor 34 since the base terminal 26 is more positive than the ground potential at the base terminal of transistor 34. Likewise, current illustrated as $i_1$ flows as collector current through transistor 34 when the terminal 26 is brought to a $-e_2$ voltage level, since the base terminal of transistor 34 is more positive than the base at terminal 26, and no current flows through transistor 12.

Thus, it can be seen that with transistor 22 in a nonconductive stage, as previously mentioned, and the terminal 26 at a $-e_2$ voltage level, both transistors 12 and 22 are virtually removed from the circuit during this portion of the circuit operation.

With the base-collector junction of transistor 34 in a forward biased state, and collector current $i_1$ flowing, it follows from conventional characteristic curves for collector to emitter voltage ($V_{ce}$) versus collector current ($I_c$) for an NPN silicon transistor that the $V_{ce}$ of transistor 34 is reverse biased. For conventional NPN silicon transistors such a $V_{ce}$ may be in the region of +.1 volts. Thus, by way of example, the collector of transistor 34 might be in the area of —.6 volts and the emitter at —.7 volts. Moreover, by virtue of the connection 30, the collector-base voltage of transistor 14 is biased slightly in a forward direction. In the illustrative example, the collector-to-base voltage of transistor 14 would be approximately —.1 volts due to the connection 30 and the direct connection between the emitter of transistor 34 and the collector of transistor 14. With the collector-to-base voltage of transistor 14 at approximately —.1 volts, the collector-to-base junction of transistor 14 is slightly forward biased. In other words, instead of being deeply forward biased as in the prior art circuit of FIGURE 1, and thus deeply saturated, the collector-to-base voltage on transistor 14 is maintained in a slightly forward biased state. This is contrasted to the prior art circuit of FIGURE 1 wherein the collector-to-base voltage of transistor 14 is driven into a highly forward biased state (much higher than —.1 volts), thus driving the transistor 14 into a deeply saturated condition.

When the potential at terminal 26 again traverses to the up logical up level ($e_1$), the potential at node 36 rises and renders transistor 34 nonconductive thereby cutting off the current flow through resistor 32 and returning the base potential of transistor 14 to approximately ground level. It thus can be see that the saturation control action of transistor 34 comes into play only when the input at terminal 26 is at its low level. At all other times transistor 34 is essentially out of the circuit, while no mention has been made of the action of transistor 22, it should be realized that it performs the inhibit function identically for the circuits of FIGS. 1 and 2.

While the invention has been particularly shown and described with reference to a preferred embodiment thereof, it will be understood by those skilled in the art that the foregoing and other changes in form and details may be made therein without departing from the spirit and scope of the invention.

We claim:

1. A transistor switching circuit comprising first and second semiconductor means each provided with base, collector and emitter terminals, the emitter terminal of said first semiconductor connected to the collector terminal of said second semiconductor, means for applying logic signals to the base terminal of said first semiconductor, impedance means for establishing a potential at the base terminal of said second semiconductor, control means coupled between the base and collector terminals of said second semiconductor means, said control means responsive to the application of a logic signal to said first semiconductor to establish a predetermined potential at the collector of said semiconductor and to shift the potential at the base terminal of said second semiconductor in a direction to prevent the saturation of said second semiconductor.

2. The invention of claim 1 wherein said impedance means comprises a resistor coupled to a source of reference potential.

3. The invention as claimed in claim 2 wherein said control means includes a multiterminal semiconductor means which is rendered conductive upon the application of a logic signal to said first semiconductor to allow a current to flow through said resistor which shifts the base potential of said second semiconductor in a direction to prevent the saturation of said second semiconductor.

4. The invention as defined in claim 3 wherein said third semiconductor means comprises a transistor having an emitter base and collector, the emitter of said third semiconductor being connected to the common connection between the emitter terminal of said first semiconductor and the collector terminal of said second semiconductor, the base terminal of said third semiconductor being connected to a source of common potential, and the collector terminal of said third semiconductor being connected to said resistor and the base terminal of said second semiconductor.

References Cited

UNITED STATES PATENTS

| | | | |
|---|---|---|---|
| 3,118,073 | 1/1964 | Walsh ---------- | 307—300 X |
| 3,248,561 | 4/1966 | Walsh ---------- | 307—218 X |

DONALD D. FORRER, Primary Examiner

U.S. Cl. X.R.

307—217, 218, 300